United States Patent
Liu et al.

(10) Patent No.: US 10,515,811 B2
(45) Date of Patent: Dec. 24, 2019

(54) SEMICONDUCTOR DEVICE WITH CHLORINE-CONTAINING N-WORK FUNCTION CONDUCTOR AND METHOD OF FORMING THE SAME

(71) Applicant: TAIWAN SEMICONDUCTOR MANUFACTURING CO., LTD., Hsinchu (TW)

(72) Inventors: Li-Jung Liu, Kaohsiung (TW); Chun-Sheng Liang, Changhua County (TW); Shu-Hui Wang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/024,291

(22) Filed: Jun. 29, 2018

(65) Prior Publication Data

US 2018/0323303 A1    Nov. 8, 2018

Related U.S. Application Data

(63) Continuation of application No. 15/497,254, filed on Apr. 26, 2017, now Pat. No. 10,043,910.

(51) Int. Cl.
| | | |
|---|---|---|
| H01L 29/78 | (2006.01) | |
| H01L 21/285 | (2006.01) | |
| H01L 29/49 | (2006.01) | |
| H01L 29/66 | (2006.01) | |
| H01L 29/423 | (2006.01) | |
| H01L 29/165 | (2006.01) | |

(52) U.S. Cl.
CPC .. *H01L 21/28556* (2013.01); *H01L 29/42376* (2013.01); *H01L 29/4966* (2013.01); *H01L 29/66545* (2013.01); *H01L 29/66795* (2013.01); *H01L 29/785* (2013.01); *H01L 29/165* (2013.01); *H01L 29/7848* (2013.01)

(58) Field of Classification Search
CPC .......... H01L 29/7856; H01L 21/28556; H01L 29/28556; H01L 29/513; H01L 29/66795
See application file for complete search history.

(56) References Cited

U.S. PATENT DOCUMENTS

| | | | |
|---|---|---|---|
| 8,193,641 B2 | 6/2012 | Rachmady et al. | |
| 9,136,131 B2 | 9/2015 | Konduparthi et al. | |
| 9,564,440 B2 | 2/2017 | Cho et al. | |
| 2003/0116057 A1* | 6/2003 | Suzuki .................. | B22F 1/0018 106/31.33 |
| 2017/0186603 A1 | 6/2017 | Moon et al. | |
| 2018/0122709 A1* | 5/2018 | Xie .......................... | H01L 29/78 |

OTHER PUBLICATIONS

Masaru Moriwaki, Takayuki Yamada, "Influences of Residual Chlorine in CVD-TiN gate Electrode on the Gate Oxide Reliability in Multiple-thickness Oxide Technology", Apr. 2001, Japanese Journal of Applied Physics, vol. 40, pp. 2679-2684. (Year: 2001).*

* cited by examiner

Primary Examiner — William Coleman
(74) Attorney, Agent, or Firm — Maschoff Brennan (57) ABSTRACT

A semiconductor device includes a semiconductor substrate, a filling conductor, an N-work function conductor layer and a gate dielectric layer. The filling conductor is over the semiconductor substrate. The N-work function conductor layer wraps around the filling conductor. The N-work function conductor layer comprises chlorine. The gate dielectric layer is between the N-work function conductor layer and the semiconductor.

20 Claims, 11 Drawing Sheets

SEMICONDUCTOR DEVICE WITH CHLORINE-CONTAINING N-WORK FUNCTION CONDUCTOR AND METHOD OF FORMING THE SAME

PRIORITY CLAIM AND CROSS-REFERENCE

The present application is a continuation application of U.S. application Ser. No. 15/497,254, filed Apr. 26, 2017, which is herein incorporated by reference in their entirety.

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' formed in a free standing manner over a major surface of a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials. For example, high-k metal gate (HKMG) processes have been applied to Fin-FETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1:
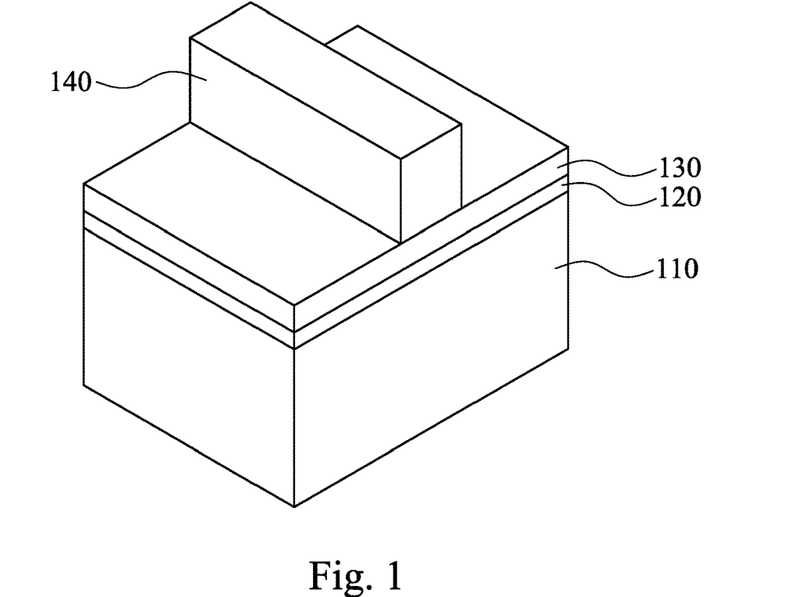
FIG. 1 to FIG. 17 illustrate a method for manufacturing a semiconductor device at various stages in accordance with some embodiments of the present disclosure.

FIG. 1 to FIG. 17 illustrate a method for manufacturing a semiconductor device at various stages in accordance with some embodiments of the present disclosure. Reference is made to FIG. 1. A substrate 110 is illustrated, and it may be a semiconductor substrate, such as a bulk semiconductor, a semiconductor-on-insulator (SOI) substrate, or the like. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A pad layer 120 and a mask layer 130 are formed on the substrate 110. The pad layer 120 may be a thin film comprising silicon oxide formed using, for example, a thermal oxidation process. The pad layer 120 may act as an adhesion layer between the substrate 110 and mask layer 130. The pad layer 120 may also act as an etch stop layer for etching the mask layer 130. In some embodiments, the mask layer 130 is formed of silicon nitride, for example, using low-pressure chemical vapor deposition (LPCVD) or plasma enhanced chemical vapor deposition (PECVD). The mask layer 130 is used as a hard mask during subsequent photolithography processes. A photo-sensitive layer 140 is formed on the mask layer 130 and is then patterned, forming openings in the photo-sensitive layer 140, so that some regions of the mask layer 130 are exposed.

Figure 2:
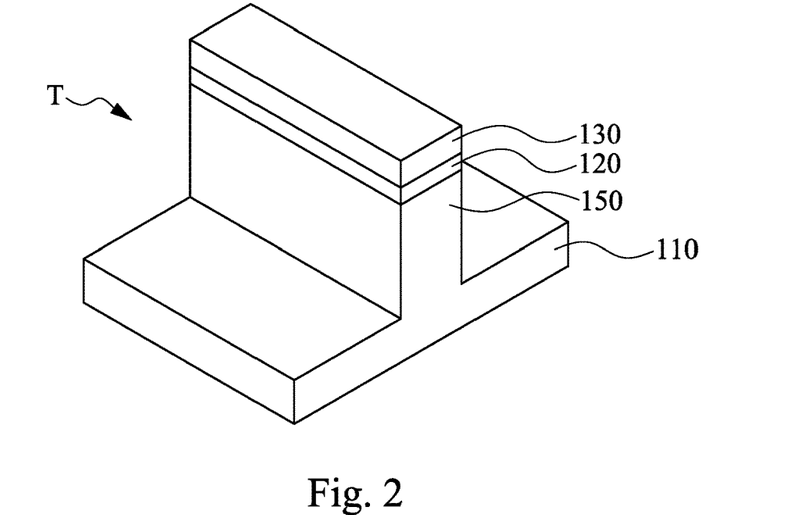

Reference is made to FIG. 2. The mask layer 130 and pad layer 120 are etched through the photo-sensitive layer 140, exposing underlying substrate 110. The exposed substrate 110 is then etched, forming trenches T. A portion of the substrate 110 between neighboring trenches T forms a semiconductor fin 150 in some embodiments. Trenches T may be trench strips (when viewed in the top view the semiconductor device) that are substantially parallel to each other. After etching the substrate 110, the photo-sensitive layer 140 is removed. Next, a cleaning step may be performed to remove a native oxide of the semiconductor substrate 110. The cleaning may be performed using diluted hydrofluoric (HF) acid, for example.

Figure 3:
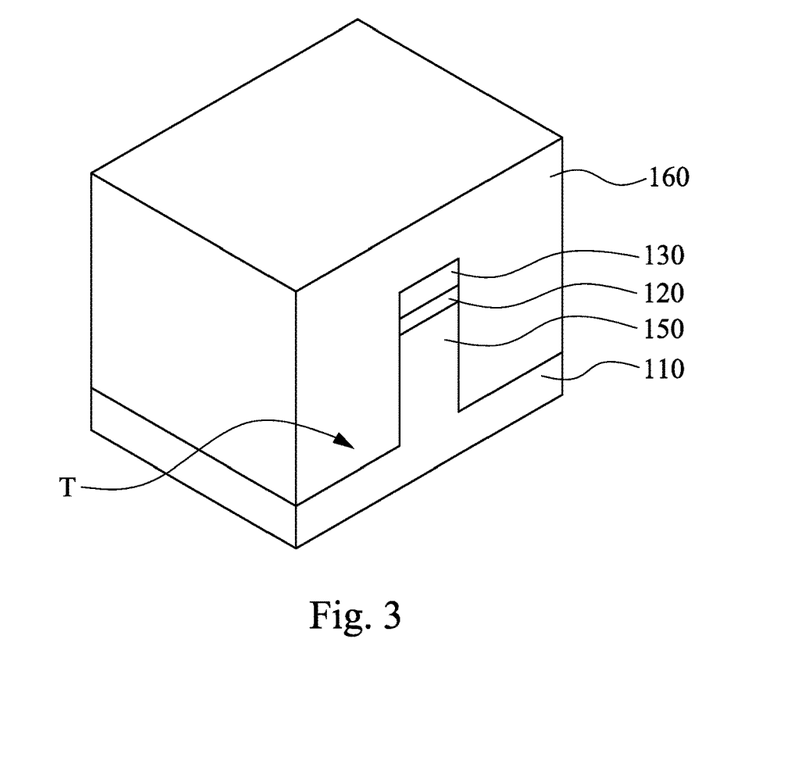

After photo-sensitive layer 140 is removed, an isolation dielectric 160 is formed to cover the semiconductor fin 150 over substrate 110, the isolation dielectric 160 may overfill the trenches T, and the resulting structure is shown in FIG. 3. The isolation dielectric 160 in the trenches T can be referred to as shallow trench isolation (STI) structure. In some embodiments, the isolation dielectric 160 is made of silicon oxide, silicon nitride, silicon oxynitride, fluoride-doped silicate glass (FSG), or other low-K dielectric materials. In some embodiments, the isolation dielectric 160 may be formed using a high-density-plasma (HDP) chemical vapor deposition (CVD) process, using silane ($SiH_4$) and oxygen ($O_2$) as reacting precursors. In some other embodiments, the isolation dielectric 160 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation dielectric 160 may be formed using a spin-on-dielectric (SOD) process, such as hydrogen silsesquioxane (HSQ) or methyl silsesquioxane (MSQ). Other processes and materials may be used. In some embodiments, the isolation dielectric 160 can have a multi-layer structure, for example, a thermal oxide liner layer with silicon nitride formed over the liner. Thereafter, a thermal annealing may be optionally performed to the isolation dielectric 160.

Figure 4:
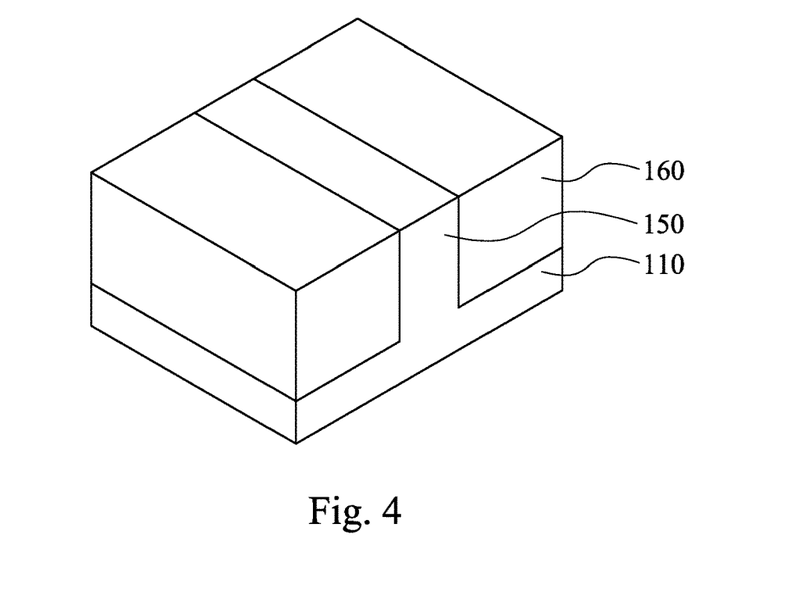

Next, a planarization process such as chemical mechanical polish (CMP) is then performed to remove the excess isolation dielectric 160 outside the trenches T, and the resulting structure is shown in FIG. 4. In some embodiments, the planarization process may also remove the mask layer 130 and the pad layer 120 such that the semiconductor fin 150 is exposed. In some other embodiments, the planarization process stops when the mask layer 130 is exposed. In such embodiments, the mask layer 130 may act as the CMP stop layer in the planarization. If the mask layer 130 and the pad layer 120 are not removed by the planarization process, the mask layer 130, if formed of silicon nitride, may be remove by a wet process using hot $H_3PO_4$, and the pad layer 120, if formed of silicon oxide, may be removed using diluted HF.

Figure 5:
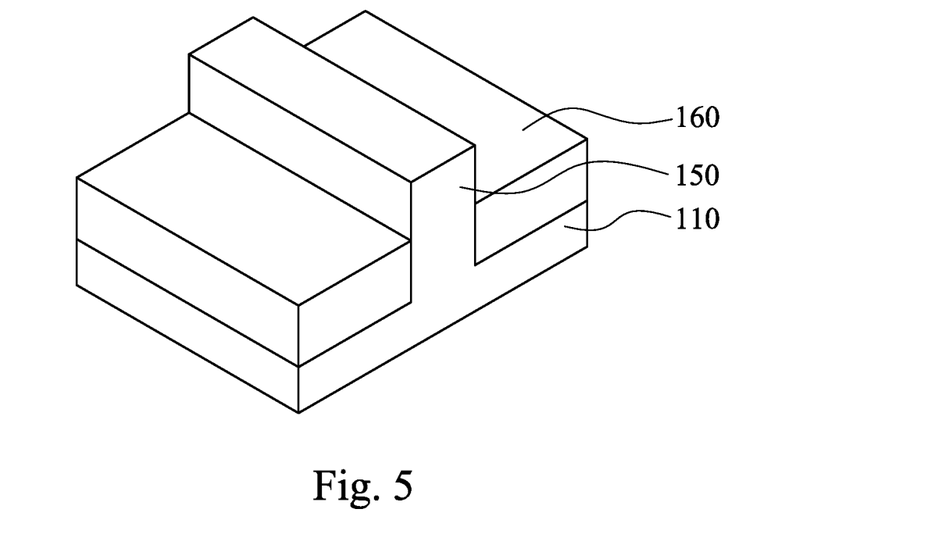

Next, as shown in FIG. 5, the isolation dielectric 160 is recessed, for example, through an etching operation, wherein diluted HF, SiCoNi (including HF and $NH_3$), or the like, may be used as the etchant. After recessing the isolation dielectric 160, a portion of the semiconductor fin 150 is higher than a top surface of the isolation dielectric 160. In other words, this portion of the semiconductor fin 150 protrudes above the isolation dielectric 160, and a lower portion of the semiconductor fin 150 is embedded in the isolation dielectric 160.

Figure 6:
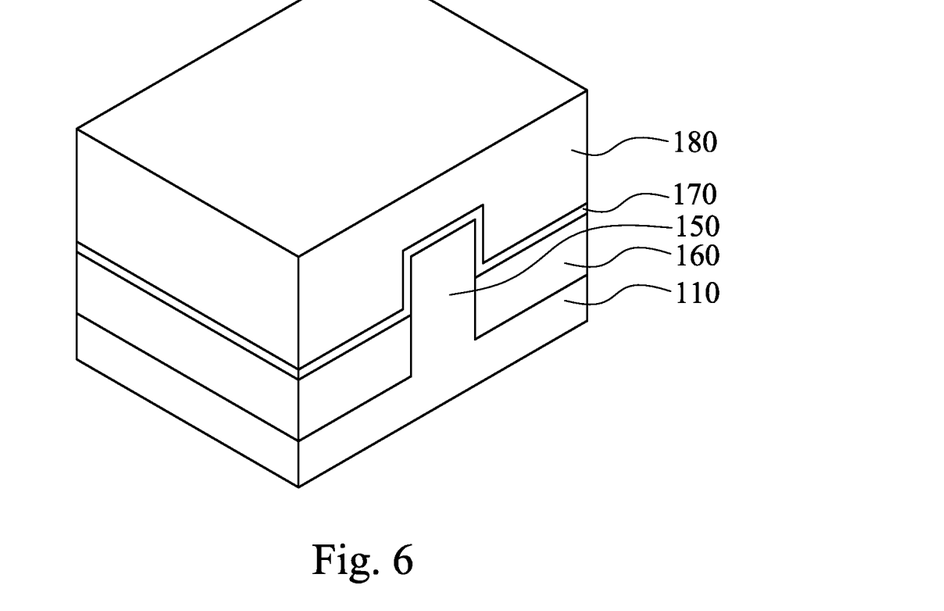

Reference is made to FIG. 6. A gate dielectric layer 170 is blanket formed over the substrate 110 to cover the semiconductor fin 150 and the isolation dielectric 160. In some embodiments, the gate dielectric layer 170 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HMO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 170 is an oxide layer. The gate dielectric layer 170 may be formed by a deposition processes, such as chemical vapor deposition (CVD), physical vapor deposition (PVD), atomic layer deposition (ALD), plasma enhanced CVD (PECVD) or other suitable techniques.

After the gate dielectric layer 170 is formed, a dummy gate electrode layer 180 is formed over the gate dielectric layer 170. In some embodiments, the dummy gate electrode layer 180 may include polycrystalline-silicon (poly-Si), poly-crystalline silicon-germanium (poly-SiGe), metallic nitrides, metallic silicides, metallic oxides, or metals. In some embodiments, the dummy gate electrode layer 180 includes a metal-containing material such as TiN, TaN, TaC, Co, Ru, Al, combinations thereof, or multi-layers thereof. The dummy gate electrode layer 180 may be deposited by CVD, physical vapor deposition (PVD), sputter deposition, or other techniques suitable for depositing conductive materials.

Figure 7:
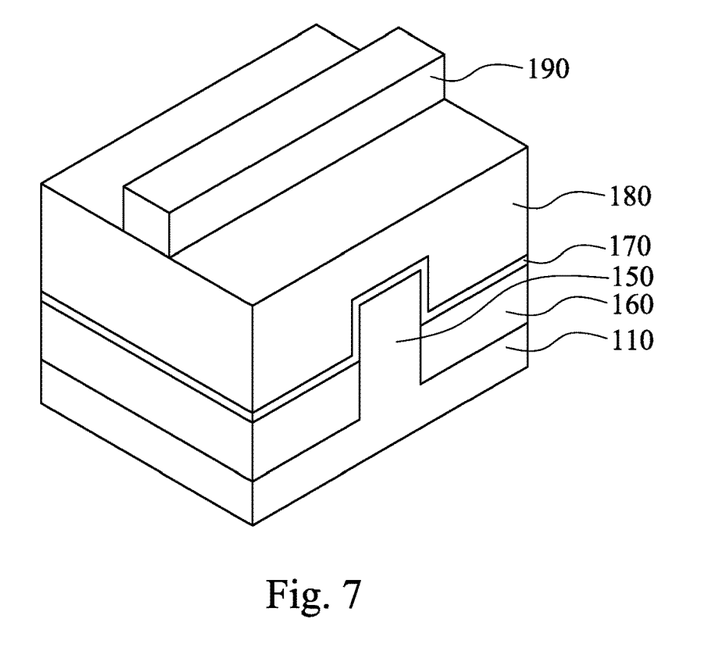

Next, the dummy gate electrode layer 180 and the gate dielectric layer 170 are patterned to form a dummy gate structure in accordance with some embodiments. For example, a mask 190 is formed over a portion of the dummy gate electrode layer 180, as shown in FIG. 7. The mask 190 may be a hard mask for protecting the underlying dummy gate electrode layer 180 and the gate dielectric layer 170 against subsequent etching process. The mask 190 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 8:
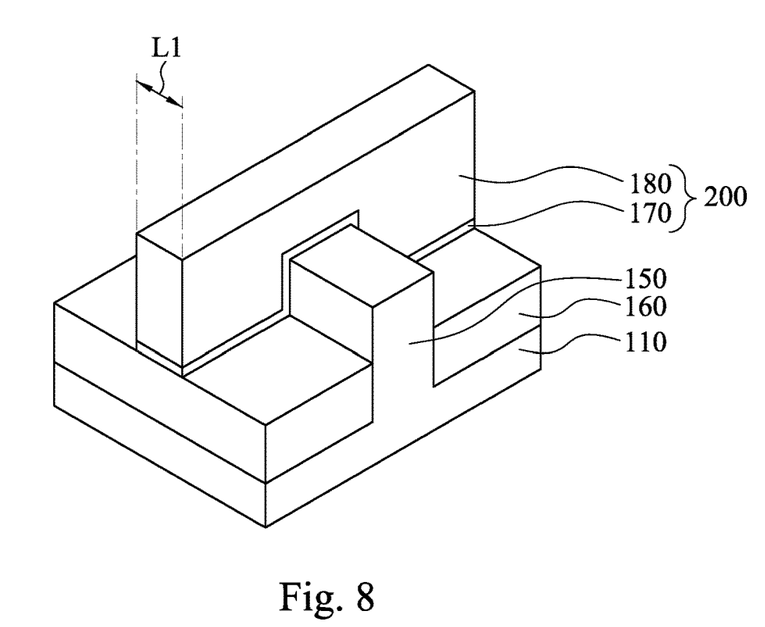

After the mask 190 is formed, an etching process is performed to form a dummy gate structure 200 wrapping a portion of the semiconductor fin 150, and the mask 190 is removed after the etching. The resulting structure is shown in FIG. 8. The dummy gate structure 200 includes portions of the dummy gate electrode layer 180 and gate dielectric layer 170 covered and protected by the mask 190. Gate length L1 of the dummy gate structure 200 can be determined by the mask 190, and the gate length L1 can be reduced to benefit shrinkage of the semiconductor device. In some embodiments, as illustrated, a central portion of the semiconductor fin 150 can be wrapped by the dummy gate structure 200. The dummy gate structure 200 has a longitudinal axis substantially perpendicular to a longitudinal axis of the semiconductor fin 150. Moreover, the dummy gate structure 200 may cross over a plurality of substantially parallel semiconductor fins 150 (this arrangement is not shown). The dummy gate structure 200 will be replaced with a replacement gate structure using a "gate-last" or replacement-gate process.

Figure 9:
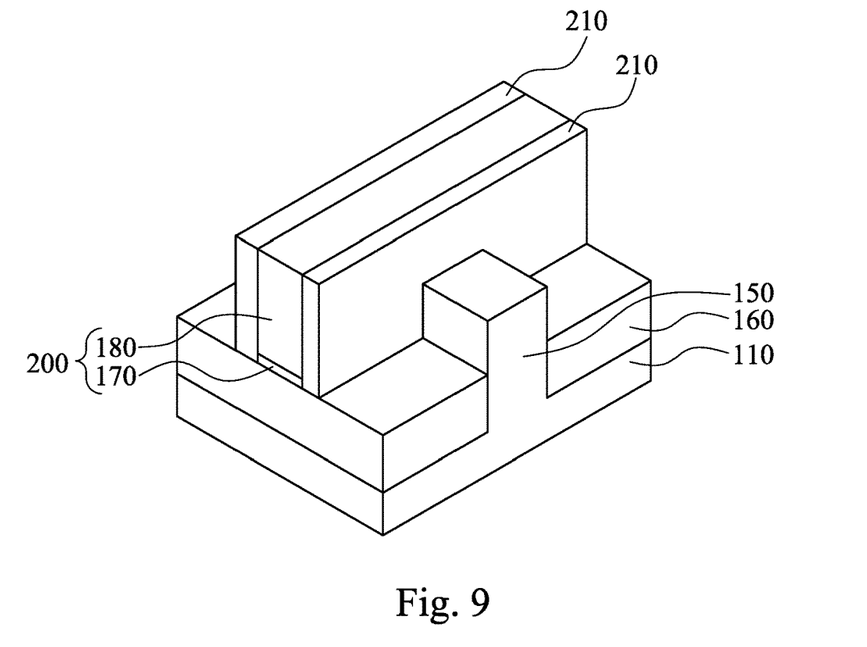

Reference is made to FIG. 9. Gate spacers 210 are formed on opposite sidewalls of the dummy gate structure 200. In some embodiments, the gate spacers 210 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 210 may include a single layer or multilayer structure made of different dielectric materials. The method of forming the gate spacers 210 includes blanket forming a dielectric layer on the structure shown in FIG. 8 using, for example, CVD, PVD or ALD, and then performing an etching process such as anisotropic etching to remove horizontal portions of the dielectric layer. The remaining portions of the dielectric layer on sidewalls of the dummy gate structure 200 can serve as the gate spacers 210. In some embodiments, the gate spacers 210 may be used to offset subsequently formed doped regions, such as source/drain regions. The gate spacers 210 may further be used for designing or modifying the source/drain region profile.

Figure 10:
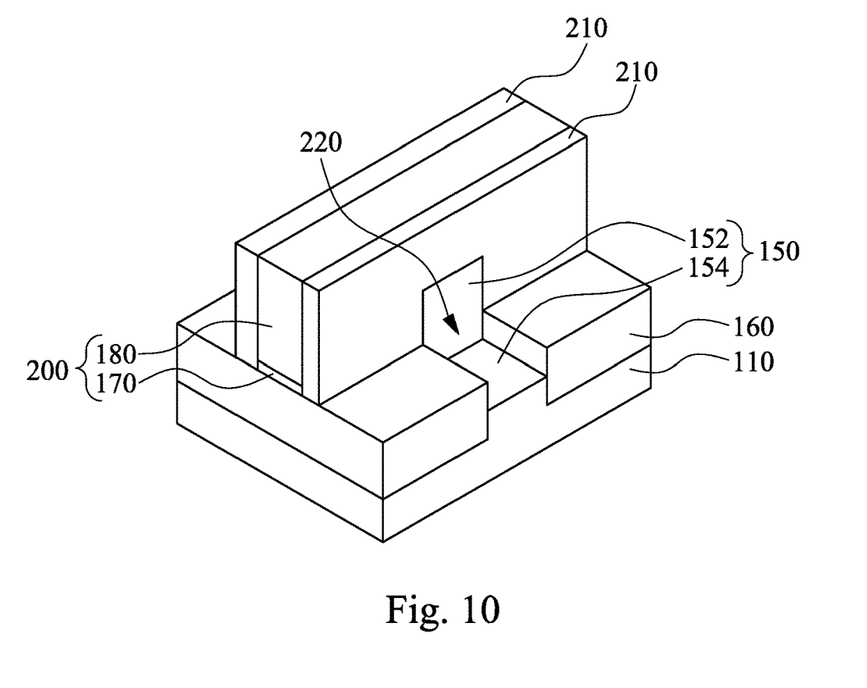

Reference is made to FIG. 10. Portions of the semiconductor fin 150 not covered by the dummy gate structure 200 and the gate spacers 210 are respectively partially removed (or partially recessed) to form recesses 220. The remaining semiconductor fin 150 may have a protruding portion 152 and embedded portions 154 after this removal. The embedded portions 154 are embedded in the isolation dielectric 160, and the embedded portions 154 are at least partially exposed by the recesses 220, respectively. The protruding portion 152 protrudes from the embedded portions 154 and located between the recesses 220. The dummy gate structure 200 and the gate spacers 210 wrap the protruding portion 152, and opposite sidewalls of the protruding portion 152 are respectively exposed by the gate spacers 210. The protruding portion 152 wrapped by the dummy gate structure 200 can act as a channel region of the semiconductor device, and the embedded portions 154 spaced apart from the dummy gate structure 200 can act as source/drain regions of the semiconductor device.

Formation of the recesses 220 may include a dry etching process, a wet etching process, or combination dry and wet etching processes. This etching process may include reactive ion etch (RIE) using the dummy gate structure 200 and gate spacers 210 as masks, or by any other suitable removal process. In some embodiments, the etching process may be performed under a pressure of about 1 mTorr to 1000 mTorr, a power of about 50 W to 1000 W, a bias voltage of about 20 V to 500 V, at a temperature of about 40° C. to 60° C., using a HBr and/or $Cl_2$ as etch gases. Also, in the embodiments provided, the bias voltage used in the etching process may be tuned to allow good control of an etching direction to achieve desired profiles for the embedded portions 154 of the semiconductor fin 150. After the etching process, a pre-cleaning process may be performed to clean the recesses 220 with hydrofluoric acid (HF) or other suitable solution in some embodiments.

Figure 11:
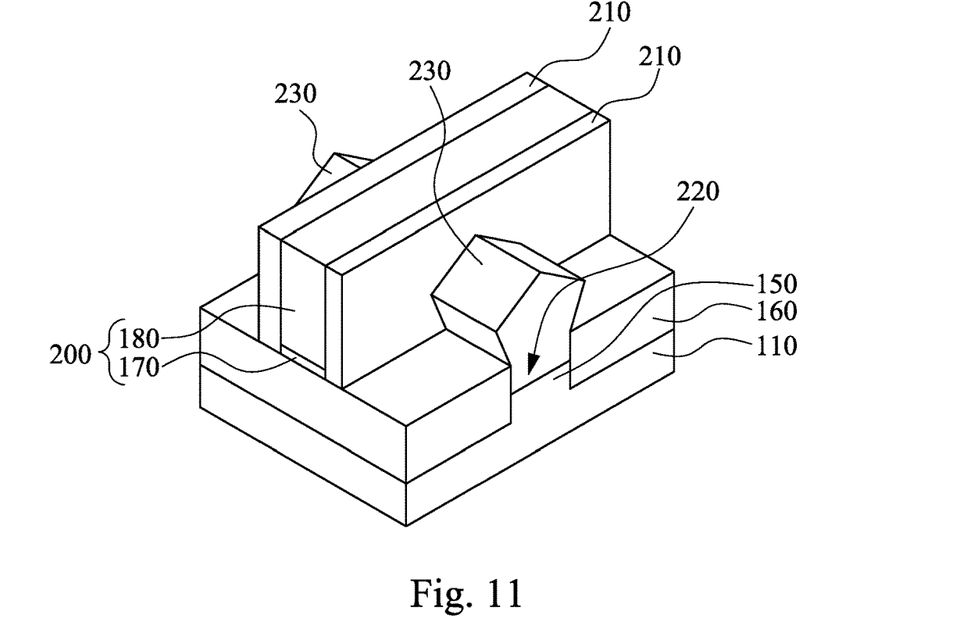

Reference is made to FIG. 11. Epitaxial source/drain structures 230 are respectively formed in the recesses 220. The epitaxial source/drain structures 230 may be formed using one or more epitaxy or epitaxial (epi) processes, such that Si features, SiGe features, silicon phosphate (SiP) features, silicon carbide (SiC) features and/or other suitable features can be formed in a crystalline state on the embedded portions 154 of the semiconductor fin 150. In some embodiments, lattice constants of the epitaxial source/drain structures 230 are different from that of the semiconductor fin 150, so that the channel region between the epitaxial source/drain structures 230 can be strained or stressed by the epitaxial source/drain structures 230 to improve carrier mobility of the semiconductor device and enhance the device performance.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 150 (e.g., silicon, silicon germanium, silicon phosphate, or the like). The epitaxial source/drain structures 230 may be in-situ doped. The doping species include P-type dopants, such as boron or $BF_2$; N-type dopants, such as phosphorus or arsenic; and/or other suitable dopants including combinations thereof. If the epitaxial source/drain structures 230 are not in-situ doped, a second implantation process (i.e., a junction implant process) is performed to dope the epitaxial source/drain structures 230. One or more annealing processes may be performed to activate the epitaxial source/drain structures 230. The annealing processes include rapid thermal annealing (RTA) and/or laser annealing processes.

Figure 12:
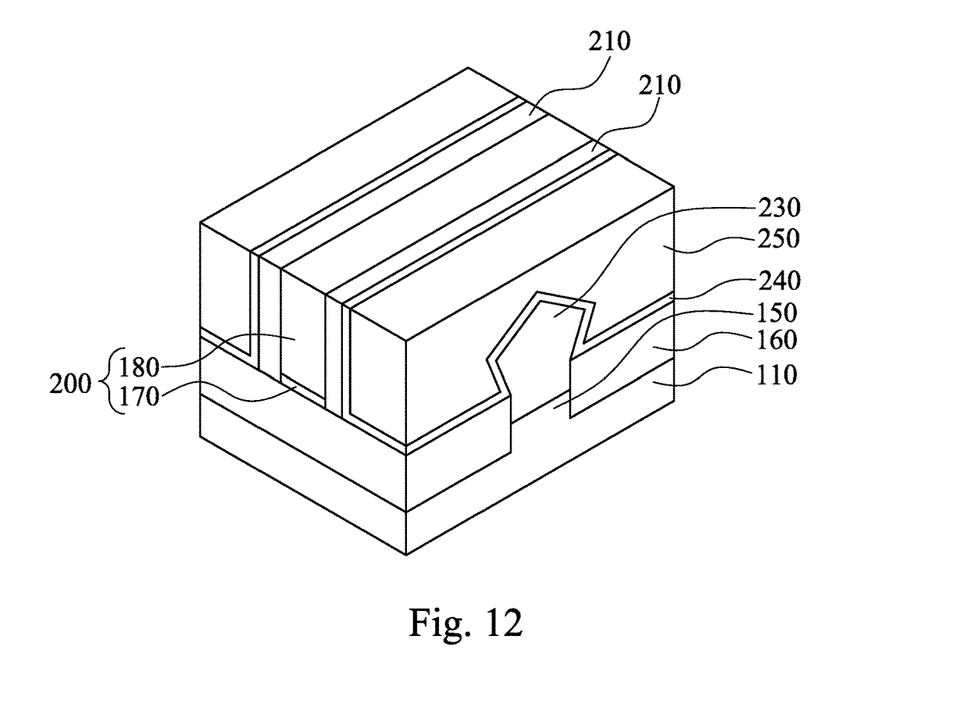

Reference is made to FIG. 12. A contact etch stop layer (CESL) 240 is blanket formed on the structure shown in FIG. 11, and then, an interlayer dielectric (ILD) layer 250 is formed on the CESL 240. Afterwards, a CMP process may be performed to remove excessive material of the ILD layer 250 and the CESL 240 to expose the dummy gate structure 200 to a subsequent dummy gate removal process. The CMP process may planarize a top surface of the ILD layer 250 with top surfaces of the dummy gate structure 200, gate spacers 210 and the CESL 240 in some embodiments. The CESL 240 includes silicon nitride, silicon oxynitride or other suitable materials. The CESL 240 can be formed using, for example, plasma enhanced CVD, low pressure CVD, ALD or other suitable techniques. The ILD layer 250 may include a material different from the CESL 240. In some embodiments, the ILD layer 250 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 250 may be formed using, for example, CVD, ALD, spin-on-glass (SOG) or other suitable techniques.

Figure 13:
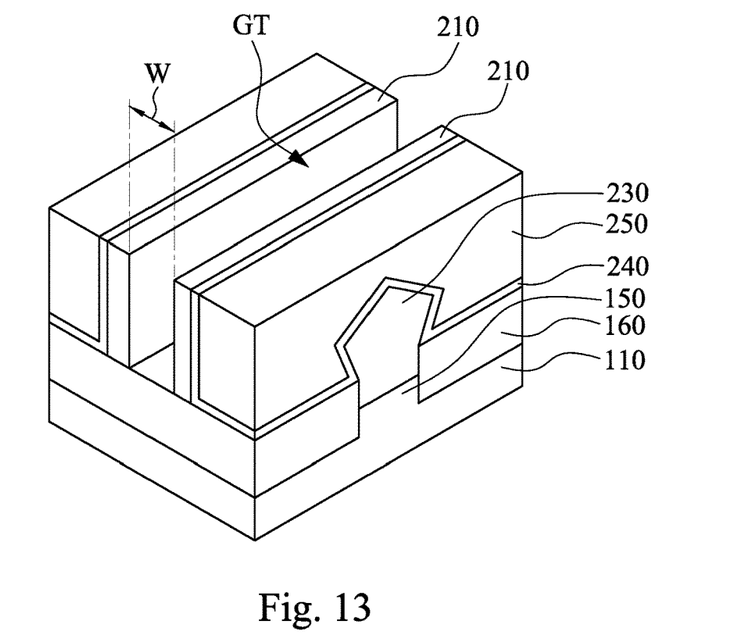

Next, the dummy gate structure 200 is removed to form a gate trench GT with the gate spacers 210 as its sidewalls, and the resulting structure is shown in FIG. 13. In some embodiments, the dummy gate structure 200 is removed by performing a first etching process and performing a second etching process after the first etching process. In some embodiments, the dummy gate electrode layer 180 is mainly removed by the first etching process, and the gate dielectric layer 170 is mainly removed by the second etching process. In some embodiments, the first etching process is a dry etching process and the second etching process is a wet etching process. In some embodiments, the dry etching process includes using an etching gas such as $CF_4$, Ar, $NF_3$, $Cl_2$, He, HBr, $O_2$, $N_2$, $CH_3F$, $CH_4$, $CH_2F_2$, or combinations thereof. In some embodiments, the dry etching process is performed at a temperature in a range from about 20° C. to about 80° C. In some embodiments, the dry etching process is performed at a pressure in a range from about 1 mTorr to about 100 mTorr. In some embodiments, the dry etching process is performed at a power in a range from about 50 W to about 1500 W.

As illustrated, because the gate trench GT is formed by removing the dummy gate structure 200, a width W of the gate trench GT is substantially the same as the gate length of the dummy gate structure 200. Although reduction of the gate length of the dummy gate structure 200 benefits shrinkage of the semiconductor device, the reduction of gate length would adversely affect filling metals into the gate trench GT in subsequent processes because the width W of gate trench GT is shortened due to this reduction. For examples, if a narrow gate trench GT has non-uniform width W, metals formed at the narrowest portion of the gate trench GT tend to block subsequent filling of a portion of the gate trench GT lower than the narrowest portion, and hence the lower portion becomes a void in the gate stack. Such a void in the gate stack may adversely affect the threshold voltage of the semiconductor device. As a result, embodiments of the present disclosure employ ultra-thin metal layers to fill the gate trench GT such that the voids in the gate stack can be prevented, as will be described in detail below.

Figure 14:
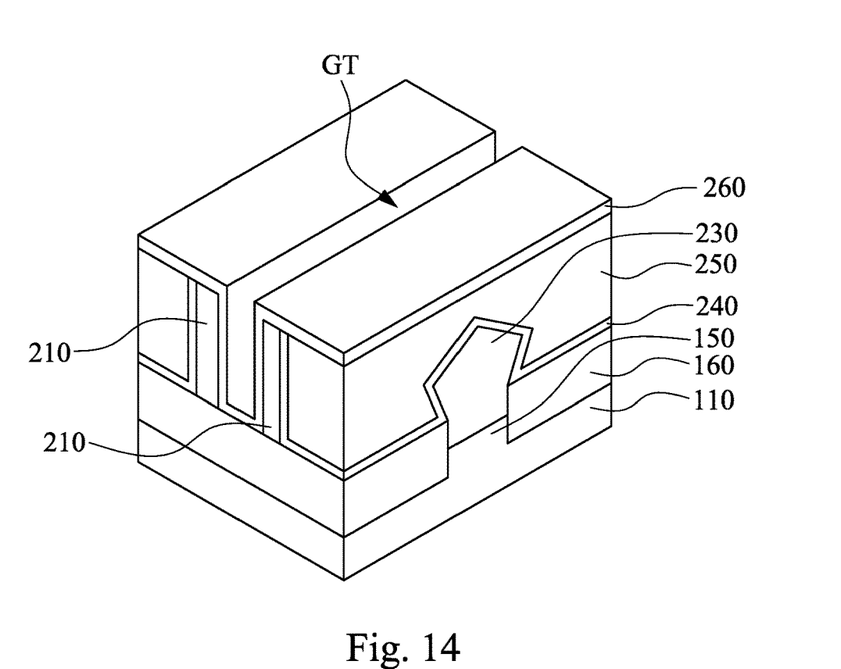

Reference is made to FIG. 14, a gate dielectric layer 260 is blanket formed over the substrate 110, and hence a portion of the gate dielectric layer 260 is formed in the gate trench GT between the gate spacers 210. More particularly, the gate dielectric layer 260 is conformally formed in the gate trench GT. In some embodiments, the gate dielectric layer 260 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 260 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layer 260 may have a multilayer structure such as one layer of silicon oxide (e.g., interfacial layer) and another layer of high-k material. The formation of the gate dielectric layer 260 may include molecular-beam deposition (MBD), atomic layer deposition (ALD), physical vapor deposition (PVD), chemical vapor deposition (CVD), or the like.

Figure 15:
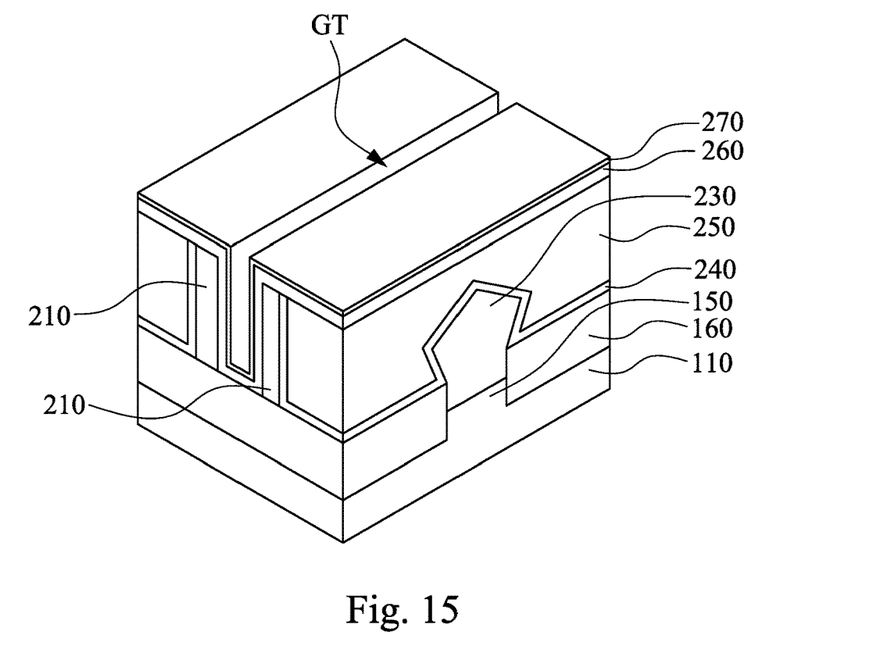

Next, as shown in FIG. 15, a titanium nitride (TiN) layer 270 is formed in the gate trench GT and over the gate dielectric layer 260. Because the gate dielectric layer 260 is conformal to the gate trench GT, the gate dielectric layer 260 has a recess or trench therein. Therefore, the TiN layer 270 can be formed into the recess or trench of the gate dielectric layer 260. More specifically, the TiN layer 270 is conformally formed over the gate dielectric layer 260. Forming of the TiN layer 270 is controlled such that the TiN layer 270 is formed as an ultra-thin film, so as to prevent the TiN layer 270 from blocking subsequent filling of the remaining gate trench GT. For example, formation of the TiN layer 270 may comprise an atomic layer deposition (ALD) process using precursors, such as titanium tetrachloride ($TiCl_4$) and $NH_3$ gas, as examples. In some embodiments, the ultra-thin TiN layer 270 has a thickness less than a thickness of the gate dielectric layer 260.

If the TiN layer 270 is too thin that an expected threshold voltage of the semiconductor device cannot be reached, an additional element can be incorporated into the TiN layer 270 to facilitate reaching the expected threshold voltage. For example, carbon can be incorporated into the TiN layer 270, and hence the TiN layer 270 can be referred to as a carbon-containing TiN layer 270 in some embodiments. Incorporation of carbon into the TiN layer 270 may be advantageous to reach the expected threshold voltage of the semiconductor device even if the TiN layer 270 is formed as an ultra-thin film. In some embodiments, formation of the carbon-containing TiN layer 270 comprises a plasma enhanced ALD (PEALD) using a carbon-containing plasma (e.g. carbon plasma), and hence carbon can be incorporated into the TiN layer 270.

Figure 16:
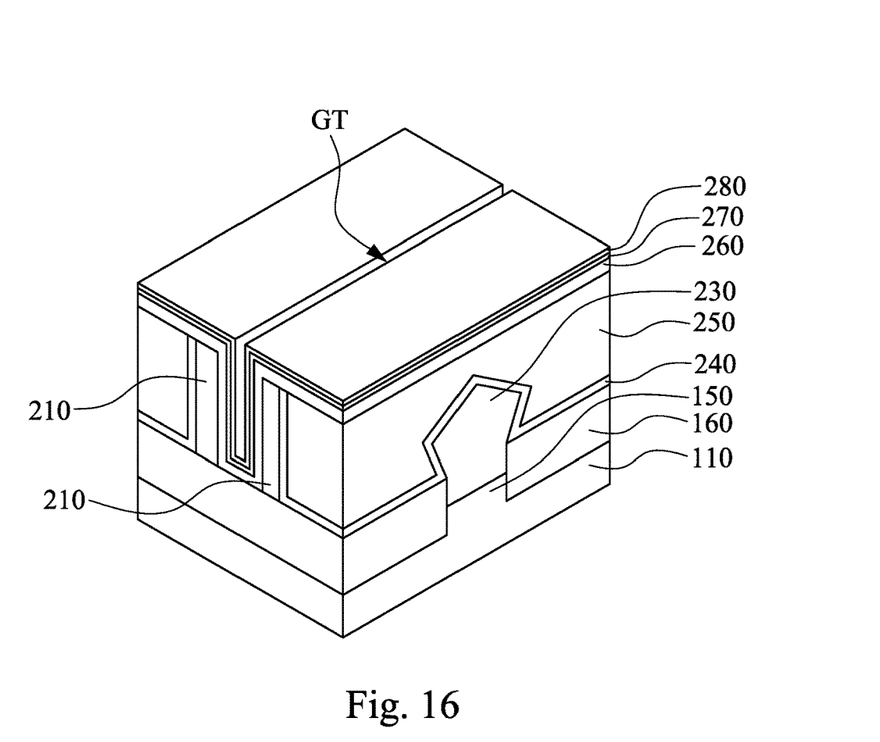

Next, as shown in FIG. 16, an N-work function conductor layer 280 is formed in the gate trench GT and over the TiN layer 270. Because the TiN layer 270 is conformal to the gate dielectric layer 260, the TiN layer 270 has a recess or trench therein. Therefore, the N-work function conductor layer 280 can be formed into the recess or trench of the TiN layer 270. More specifically, the N-work function conductor layer 280 is conformally formed over the TiN layer 270. In some embodiments, the N-work function conductor layer 280 includes N-work function metal that provides work function lower than the mid-gap work function. In other words, the work function lower than the mid-gap work function is referred to as "N-work function", and the metal having the N-work function may be referred to as an N-work function metal or an N-metal. In some embodiments, the N-work function metal has an N-work function lower than about 4.3 eV. The N-work function of the N-work function metal may also be in the range between about 3.8 eV and about 4.6 eV. In some embodiments, the N-work function conductor layer 280 may include titanium aluminum (TiAl), which may include, or free from or substantially free from other elements. In some other embodiments, the N-work function conductor layer 280 may include Ti, Ag, Al, TiAlN, TiAlC, TaC, TaCN, TaAlC, TaSiN, Mn, Zr or combinations thereof.

Forming of the N-work function conductor layer 280 is controlled such that the N-work function conductor layer 280 is formed as an ultra-thin film, so as to prevent the N-work function conductor layer 280 from blocking subsequent filling of the remaining gate trench GT. For example, formation of the N-work function conductor layer 280 may comprise an atomic layer deposition (ALD) process using an aluminum precursor, such as dimethylaluminumhydride (DMAH) or dimethylethylaminealane (DMEAA), to form aluminum-containing layer to provide suitable N-work function. In some embodiments, the N-work function conductor layer 280 has a thickness less than a thickness of the gate dielectric layer 260.

If the N-work function conductor layer 280 is too thin that an expected threshold voltage of the semiconductor device cannot be reached, an additional element can be incorporated into the N-work function conductor layer 280 to facilitate reaching the expected threshold voltage. For example, chlorine can be incorporated into the N-work function conductor layer 280, and hence the N-work function conductor layer 280 can be referred to as a chlorine-containing conductor layer 280 in some embodiments. Incorporation of chlorine into the N-work function conductor layer 280 may be advantageous to reach the expected threshold voltage of the semiconductor device even if the N-work function conductor layer 280 is formed as an ultra-thin film. In some embodiments, formation of the chlorine-containing N-work function conductor layer 280 comprises an ALD process using a chloride precursor, such as titanium tetrachloride ($TiCl_4$), tantalum pentachloride ($TaCl_5$) or the like, and hence chlorine can be incorporated into the N-work function conductor layer 280.

Figure 17:
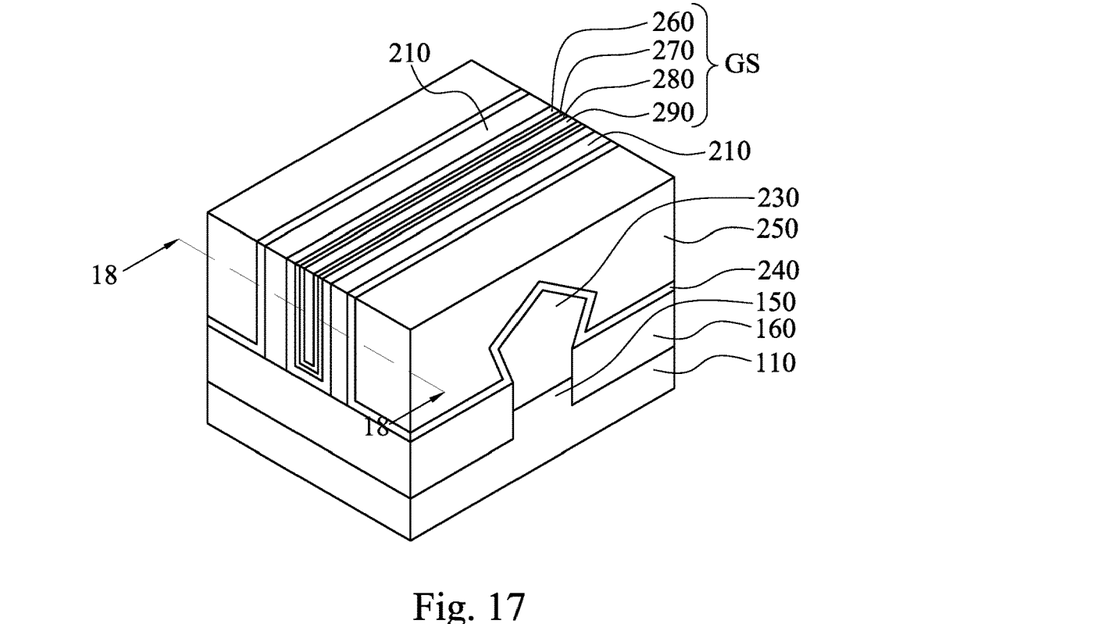

Next, as shown in FIG. 17, a filling conductor 290 is formed in the gate trench GT and over the N-work function conductor layer 280. More particularly, the filling conductor 290 fills a recess of the N-work function conductor layer 280. The gate dielectric layer 260, the TiN layer 270, the N-work function conductor layer 280 and the filling conductor 290 can be in combination referred to as a gate stack GS in between the gate spacers 210. The filling conductor 290 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials, which are formed using suitable deposition techniques. For example, the recess of the N-work function conductor layer 280 is overfilled with the filling conductor 290 using PVD, CVD or ALD, and a planarization process, such as a CMP process, is then performed to remove excess gate dielectric layer 260, TiN layer 270, N-work function conductor layer 280 and filling conductor 290 outside the gate trench GT, and the resulting structure is shown in FIG. 17.

Figure 18:
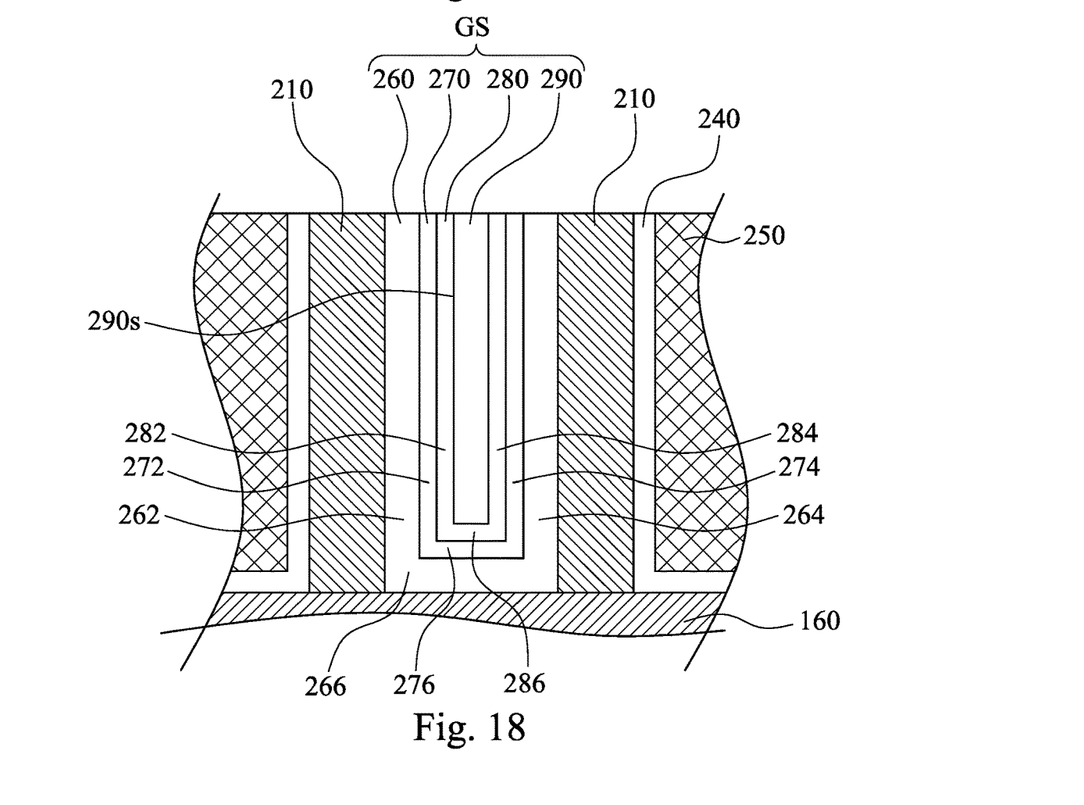
FIG. 18 is a cross-sectional view taken along line 18 in FIG. 17.

As illustrated in FIG. 18, which is a cross-sectional view taken along line 18 in FIG. 17, in the gate stack GS, the gate dielectric layer 260 wraps and contacts the TiN layer 270, the TiN layer 270 wraps and contacts the N-work function conductor layer 280, and the N-work function conductor layer 280 wraps and contacts the filling conductor 290. Specifically, the gate dielectric layer 260 includes vertical portions 262, 264 and a horizontal portion 266, the vertical portions 262 and 264 are opposite and spaced apart from each other, the horizontal portion 266 is connected between the vertical portions 262 and 264 to form a substantial U-shaped profile in the cross-sectional view. The TiN layer 270 is between the opposite vertical portions 262 and 264 of the gate dielectric layer 260.

Since the TiN layer 270 is conformal to the gate dielectric layer 260, the TiN layer 270 includes opposite vertical portions 272, 274 and a horizontal portion 276 connected between the opposite vertical portions 272 and 274 as well. The N-work function conductor layer 280 is between the opposite vertical portions 272 and 274. Similarly, because the N-work function conductor layer 280 is conformal to the TiN layer 270, the N-work function conductor layer 280 includes opposite vertical portions 282, 284 and a horizontal portion 286 connected between the opposite vertical portions 282 and 284 as well. The vertical portions 282 and 284 are spaced apart from each other, and the filling conductor 290 is between the vertical portions 282 and 284. In this configuration, the recess of the N-work function conductor layer 280 is filled by the filling conductor 290, so that voids in the gate stack GS can be prevented.

Figure 19:
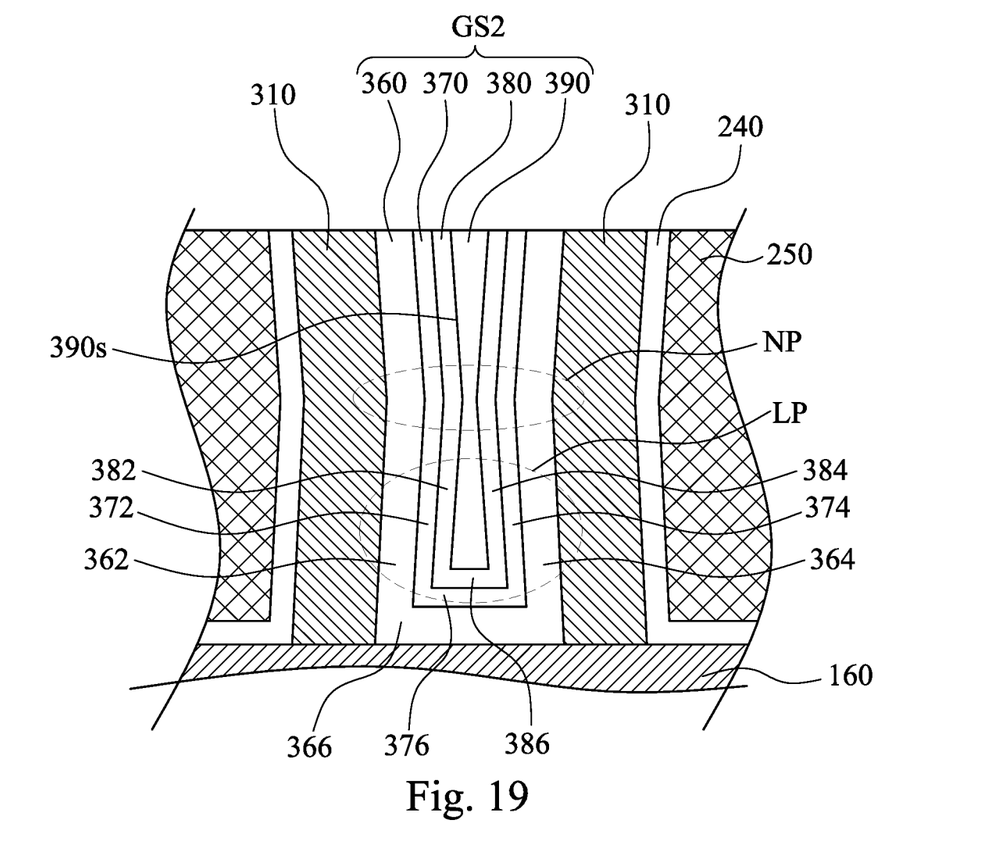
FIG. 19 is a cross-sectional view in accordance with some embodiments of the present disclosure.

FIG. 19 illustrates another semiconductor device, which shares some features of the previously described semiconductor device. Specifically, the semiconductor device may include the substrate 110 and the isolation dielectric 160 as described above. Additionally, the semiconductor device include a gate stack GS2 with a profile different from the profile of the previously described gate stack GS. Specifically, a gate trench between sloped gate spacers 310 has a non-uniform width (i.e. the width of the gate trench changes as a function of height), and hence the gate dielectric layer 360, the TiN layer 370, the N-work function conductor layer 380 and the filling conductor 390 of the gate stack GS2 conformally formed in the gate trench have sloped portions.

As illustrated, the gate trench between the gate spacers 310 has a narrowest portion NP. During deposition of the N-work function conductor layer 380, if the TiN layer 370 and/or the N-work function conductor layer 380 is too thick, the N-work function conductor layer 380 formed at the narrowest portion NP would block subsequent filling of a lower portion LP of the gate trench that is lower than the narrowest portion NP. Therefore, the lower portion LP would become a void in the gate stack GS2.

As a result, in some embodiments, the TiN layer 370 is formed as an ultra-thin film to prevent the TiN layer 370 from blocking subsequent filling of the lower portion LP of gate trench. For example, formation of the TiN layer 370 may comprise an ALD process using precursors, such as titanium tetrachloride (TiCl$_4$) and NH$_3$ gas, as examples. In some embodiments, the N-work function conductor layer 380 is formed as an ultra-thin film to prevent the N-work function conductor layer 380 from blocking subsequent filling of the lower portion LP of gate trench. For example, formation of the N-work function conductor layer 380 may comprise an ALD process using an aluminum precursor, such as dimethylaluminumhydride (DMAH) or dimethylethylaminealane (DMEAA), to form aluminum-containing layer to provide suitable N-work function. In some embodiments, the TiN layer 370 comprises carbon, and the N-work function conductor layer 380 comprises chlorine, so as to reach an expected threshold voltage, as discussed previously. Formation of the carbon-containing TiN layer 370 and the chlorine-containing N-work function conductor layer 380 is similar to layers 270 and 280 described above and is not repeated herein for the sake of brevity.

As illustrated, the gate dielectric layer 360 includes opposite sloped portions 362, 364 with different slopes and a horizontal portion 366 connected therebetween. Lower segments of the sloped portions 362 and 364 are separated by a distance that decreases as the height increases, and higher segments of the sloped portions 362 and 364 are separated by a distance that increases as the height increases. Since the TiN layer 370 is conformal to the gate dielectric layer 360, the TiN layer 370 includes opposite sloped portions 372, 374 with different slopes and a horizontal portion 376 connected therebetween. Lower segments of the sloped portions 372 and 374 are separated by a distance that decreases as the height increases, and higher segments of the sloped portions 372 and 374 are separated by a distance that increases as the height increases.

The N-work function conductor layer 380 is between the opposite sloped portions 372 and 374 of the TiN layer 370 and in contact with them. Because the N-work function conductor layer 380 is conformal to the TiN layer 370, the N-work function conductor layer 380 includes opposite sloped portions 382, 384 with different slopes and a horizontal portion 386 connected therebetween. Lower segments of the sloped portions 382 and 384 are separated by a distance that decreases as the height increases, and higher segments of the sloped portions 382 and 384 are separated by a distance that increases as the height increases.

The filling conductor 390 is between the opposite sloped portions 382 and 384 of the N-work function conductor layer 380 and in contact with them. Specifically, the filling conductor 390 fills a space between the sloped portions 382 and 384, and hence the filling conductor 390 has a higher portion and a lower portion tapering in different directions. More particularly, the filling conductor 390 has sloped sidewalls 390s in contact with the sloped portions 382 and 384. As illustrated, the lower portion of the filling conductor 390 tapers in a direction away from the isolation dielectric 160, and the higher portion of the filling conductor 390 over the lower portion tapers in a direction toward the isolation dielectric 160. Specifically, lower segments of the sloped sidewalls 390s are separated by a distance that decreases as the height increases, and higher segments of the sloped sidewalls 390s are separated by a distance that increases as the height increases.

Figure 20:
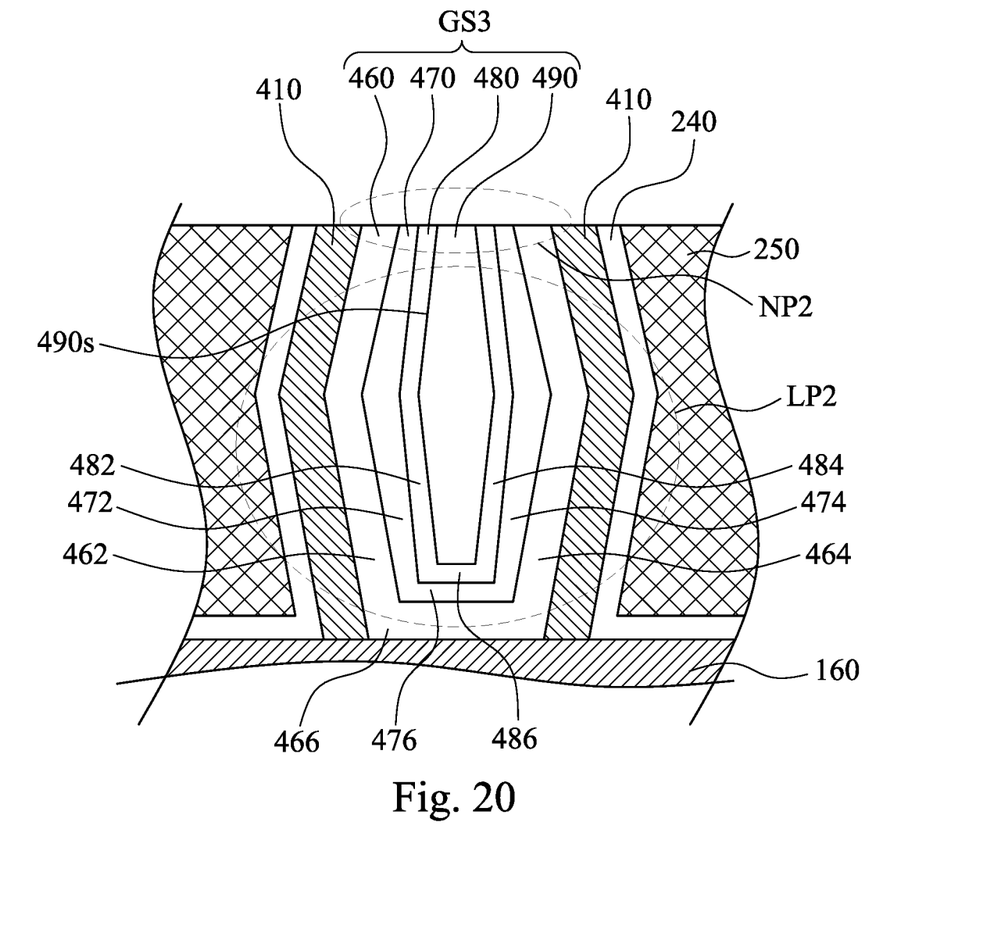
FIG. 20 is a cross-sectional view in accordance with some embodiments of the present disclosure.

FIG. 20 illustrates another semiconductor device, which shares some features of the previously described semiconductor device. Specifically, the semiconductor device may include the substrate 110 and the isolation dielectric 160 as described above. Additionally, the semiconductor device includes a gate stack GS3 with a profile different from the profile of the previously described gate stacks GS and GS2. Specifically, a gate trench between sloped gate spacers 410 has a non-uniform width (i.e. the width of the gate trench changes as a function of height), and hence the gate dielectric layer 460, the TiN layer 470, the N-work function conductor layer 480 and the filling conductor 490 of the gate stack GS3 conformally formed in the gate trench have sloped portions.

As illustrated, the gate trench between the gate spacers 410 has a narrowest portion NP2. During deposition of the N-work function conductor layer 480, if the TiN layer 470 and/or the N-work function conductor layer 480 is too thick, the N-work function conductor layer 480 formed at the narrowest portion NP2 would block subsequent filling of a lower portion LP2 of the gate trench that is lower than the narrowest portion NP2. Therefore, the lower portion LP2 would become a void in the gate stack GS3.

As a result, in some embodiments, the TiN layer 470 and the N-work function conductor layer 480 are formed as ultra-thin films to prevent them from blocking subsequent filling of the lower portion LP2 of gate trench. For example, formation of the TiN layer 470 may comprise an ALD process using precursors, such as titanium tetrachloride (TiCl$_4$) and NH$_3$ gas, as examples, and formation of the N-work function conductor layer 480 may comprise an ALD process using an aluminum precursor, such as dimethylaluminumhydride (DMAH) or dimethylethylaminealane (DMEAA). In some embodiments, the TiN layer 470 comprises carbon, and the N-work function conductor layer 480 comprises chlorine, so as to reach an expected threshold voltage, as discussed previously. Formation of the carbon-containing TiN layer 470 and the chlorine-containing N-work function conductor layer 480 is similar to layers 270 and 280 described above and is not repeated herein for the sake of brevity.

As illustrated, the gate dielectric layer 460 includes opposite sloped portions 462, 464 with different slopes and a horizontal portion 466 connected therebetween. Lower segments of the sloped portions 462 and 464 are separated by a distance that increases as the height increases, and higher segments of the sloped portions 462 and 464 are separated by a distance that decreases as the height increases. Since the TiN layer 470 is conformal to the gate dielectric layer 460, the TiN layer 470 includes opposite sloped portions 472, 474 with different slopes and a horizontal portion 476 connected therebetween. Lower segments of the sloped portions 472 and 474 are separated by a distance that increases as the height increases, and higher segments of the sloped portions 472 and 474 are separated by a distance that decreases as the height increases.

The N-work function conductor layer 480 is between the opposite sloped portions 472 and 474 of the TiN layer 470 and in contact with them. Because the N-work function conductor layer 480 is conformal to the TiN layer 470, the N-work function conductor layer 480 includes opposite sloped portions 482, 484 with different slopes and a horizontal portion 486 connected therebetween. Lower segments of the sloped portions 482 and 484 are separated by a distance that increases as the height increases, and higher segments of the sloped portions 482 and 484 are separated by a distance that decreases as the height increases.

The filling conductor 490 is between the opposite sloped portions 482 and 484 of the N-work function conductor layer 480 and in contact with them. Specifically, the filling conductor 490 fills a space between the sloped portions 482 and 484, and hence the filling conductor 490 has a higher portion and a lower portion tapering in different directions. As illustrated, the lower portion of the filling conductor 490 tapers in a direction toward the isolation dielectric 160, and the higher portion of the filling conductor 490 over the lower portion tapers in a direction away from the isolation dielectric 160.

Embodiments of the present disclosure may have at least following advantages. Ultra-thin TiN layer and ultra-thin N-work function conductor layer formed in the gate trench may be advantageous to prevent voids formed in the gate stack. Moreover, incorporation of carbon into the ultra-thin TiN layer and incorporation of chlorine into the N-work function conductor layer may be advantageous to achieve an expected threshold voltage of the semiconductor device.

According to some embodiments, a semiconductor device includes a semiconductor substrate, a filling conductor, an N-work function conductor layer and a gate dielectric layer. The filling conductor is over the semiconductor substrate. The N-work function conductor layer wraps around the filling conductor. The N-work function conductor layer comprises chlorine. The gate dielectric layer is between the N-work function conductor layer and the semiconductor.

According to some embodiments, the filling conductor and the N-work function conductor layer comprise different metals.

According to some embodiments, the semiconductor device further includes a titanium nitride layer wrapping around the N-work function conductor layer, wherein the titanium nitride layer comprises carbon.

According to some embodiments, a thickness of the titanium nitride layer is less than a thickness of the gate dielectric layer.

According to some embodiments, the N-work function conductor layer is conformal to the titanium nitride layer.

According to some embodiments, a thickness of the N-work function conductor layer is less than a thickness of the gate dielectric layer.

According to some embodiments, a semiconductor device includes a semiconductor substrate, a gate dielectric layer, a titanium nitride layer, a chlorine-containing conductor layer and a filling conductor. The gate dielectric layer is over the semiconductor substrate. The titanium nitride layer is over the gate dielectric layer. The chlorine-containing conductor layer is over and conformal to the titanium nitride layer. The chlorine-containing conductor layer includes an N-work function metal. The filling conductor is over the chlorine-containing conductor layer.

According to some embodiments, an interface between the filling conductor and the chlorine-containing conductor layer has a sloped portion.

According to some embodiments, an interface between the titanium nitride layer and the chlorine-containing conductor layer has a sloped portion.

According to some embodiments, a middle portion of the filling conductor is narrower than a top portion of the filling conductor.

According to some embodiments, the middle portion of the filling conductor is narrower than a bottom portion of the filling conductor.

According to some embodiments, a middle portion of the filling conductor is wider than a top portion of the filling conductor.

According to some embodiments, the middle portion of the filling conductor is wider than a bottom portion of the filling conductor.

According to some embodiments, the titanium nitride layer includes carbon.

According to some embodiments, a method includes forming a dummy gate structure over a semiconductor substrate, etching the dummy gate structure to form a gate trench, forming a gate dielectric layer over a bottom surface and a sidewall of the gate trench, depositing a chlorine-containing N-work function conductor layer over the gate dielectric layer, and depositing a filling conductor over the chlorine-containing N-work function conductor layer.

According to some embodiments, the chlorine-containing N-work function conductor layer is deposited using a chloride precursor.

According to some embodiments, the method further includes depositing a titanium nitride layer over the gate dielectric layer prior to depositing the chlorine-containing N-work function conductor layer.

According to some embodiments, the titanium nitride layer is deposited with a carbon-containing plasma such that the titanium nitride layer comprises carbon.

According to some embodiments, depositing the titanium nitride layer is performed such that the titanium nitride layer is thinner than the gate dielectric layer.

According to some embodiments, depositing the chlorine-containing N-work function conductor layer is performed such that the chlorine-containing N-work function conductor layer is thinner than the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a tungsten structure over the semiconductor substrate;
   an N-work function conductor layer wrapping around and in contact with the tungsten structure, wherein the N-work function conductor layer comprises chlorine; and
   a gate dielectric layer between the N-work function conductor layer and the semiconductor substrate.

2. The semiconductor device of claim 1, wherein the tungsten structure and the N-work function conductor layer comprise different metals.

3. The semiconductor device of claim 1, further comprising:
   a titanium nitride layer wrapping around the N-work function conductor layer, wherein the titanium nitride layer comprises carbon.

4. The semiconductor device of claim 1, wherein a thickness of the N-work function conductor layer is less than a thickness of the gate dielectric layer.

5. The semiconductor device of claim 1, wherein the N-work function conductor layer forms a sloped interface with the tungsten structure.

6. The semiconductor device of claim 3, wherein a thickness of the titanium nitride layer is less than a thickness of the gate dielectric layer.

7. The semiconductor device of claim 3, wherein the N-work function conductor layer is conformal to the titanium nitride layer.

8. A semiconductor device, comprising:
   a semiconductor substrate;
   a gate dielectric layer over the semiconductor substrate;
   a titanium nitride layer over the gate dielectric layer;
   a chlorine-containing conductor layer over and conformal to the titanium nitride layer, the chlorine-containing conductor layer comprising an N-work function metal, wherein an interface between the titanium nitride layer and the chlorine-containing conductor layer has a sloped portion; and
   a filling conductor over the chlorine-containing conductor layer.

9. The semiconductor device of claim 8, wherein an interface between the filling conductor and the chlorine-containing conductor layer has a sloped portion.

10. The semiconductor device of claim 8, wherein a middle portion of the filling conductor is narrower than a top portion of the filling conductor.

11. The semiconductor device of claim 8, wherein a middle portion of the filling conductor is wider than a top portion of the filling conductor.

12. The semiconductor device of claim 8, wherein the titanium nitride layer comprises carbon.

13. The semiconductor device of claim 10, wherein the middle portion of the filling conductor is narrower than a bottom portion of the filling conductor.

14. The semiconductor device of claim 11, wherein the middle portion of the filling conductor is wider than a bottom portion of the filling conductor.

15. A method, comprising:
   forming a dummy gate structure over a semiconductor substrate;
   etching the dummy gate structure to form a gate trench;
   forming a gate dielectric layer over a bottom surface and a sidewall of the gate trench;
   depositing a chlorine-containing N-work function conductor layer over the gate dielectric layer; and
   depositing a filling conductor over the chlorine-containing N-work function conductor layer to form an interface with the chlorine-containing N-work function conductor layer.

16. The method of claim 15, wherein the chlorine-containing N-work function conductor layer is deposited using a chloride precursor.

17. The method of claim 15, further comprising:
   depositing a titanium nitride layer over the gate dielectric layer prior to depositing the chlorine-containing N-work function conductor layer.

18. The method of claim 15, wherein depositing the chlorine-containing N-work function conductor layer is performed such that the chlorine-containing N-work function conductor layer is thinner than the gate dielectric layer.

19. The method of claim 17, wherein the titanium nitride layer is deposited with a carbon-containing plasma such that the titanium nitride layer comprises carbon.

20. The method of claim 17, wherein depositing the titanium nitride layer is performed such that the titanium nitride layer is thinner than the gate dielectric layer.

* * * * *